United States Patent [19]

Sutton

[11] 4,305,008

[45] Dec. 8, 1981

[54] RECTIFIERS

[75] Inventor: Roger T. Sutton, Birmingham, England

[73] Assignee: Eddystone Radio Limited, Chelmsford, England

[21] Appl. No.: 39,155

[22] Filed: May 15, 1979

[30] Foreign Application Priority Data

May 16, 1978 [GB] United Kingdom ............... 19764/78
Jun. 26, 1978 [DE] Fed. Rep. of Germany ....... 2827972

[51] Int. Cl.³ ............................................. H03K 5/00
[52] U.S. Cl. .................................. 307/261; 307/359; 328/26; 328/32
[58] Field of Search ............... 307/261, 351, 353, 359; 328/26, 32, 151; 363/89, 127

[56] References Cited

U.S. PATENT DOCUMENTS

| 3,958,170 | 5/1976 | Hodgson | 328/26 X |
| 4,004,161 | 1/1977 | Ryder | 307/261 |
| 4,082,920 | 4/1978 | Castlemann | 307/261 X |
| 4,097,767 | 6/1978 | Blackmer et al. | 307/261 X |

Primary Examiner—John Zazworsky
Attorney, Agent, or Firm—Diller, Ramik & Wight

[57] ABSTRACT

A rectifier is arranged to enable predetermined profiles for charging and discharging a capacitor to be satisfied over a wide dynamic range of input signals. The feedback loop is provided in which a charging resistance, a charging capacitor, a discharge resistor and a rectifying element are provided as separate items.

9 Claims, 2 Drawing Figures

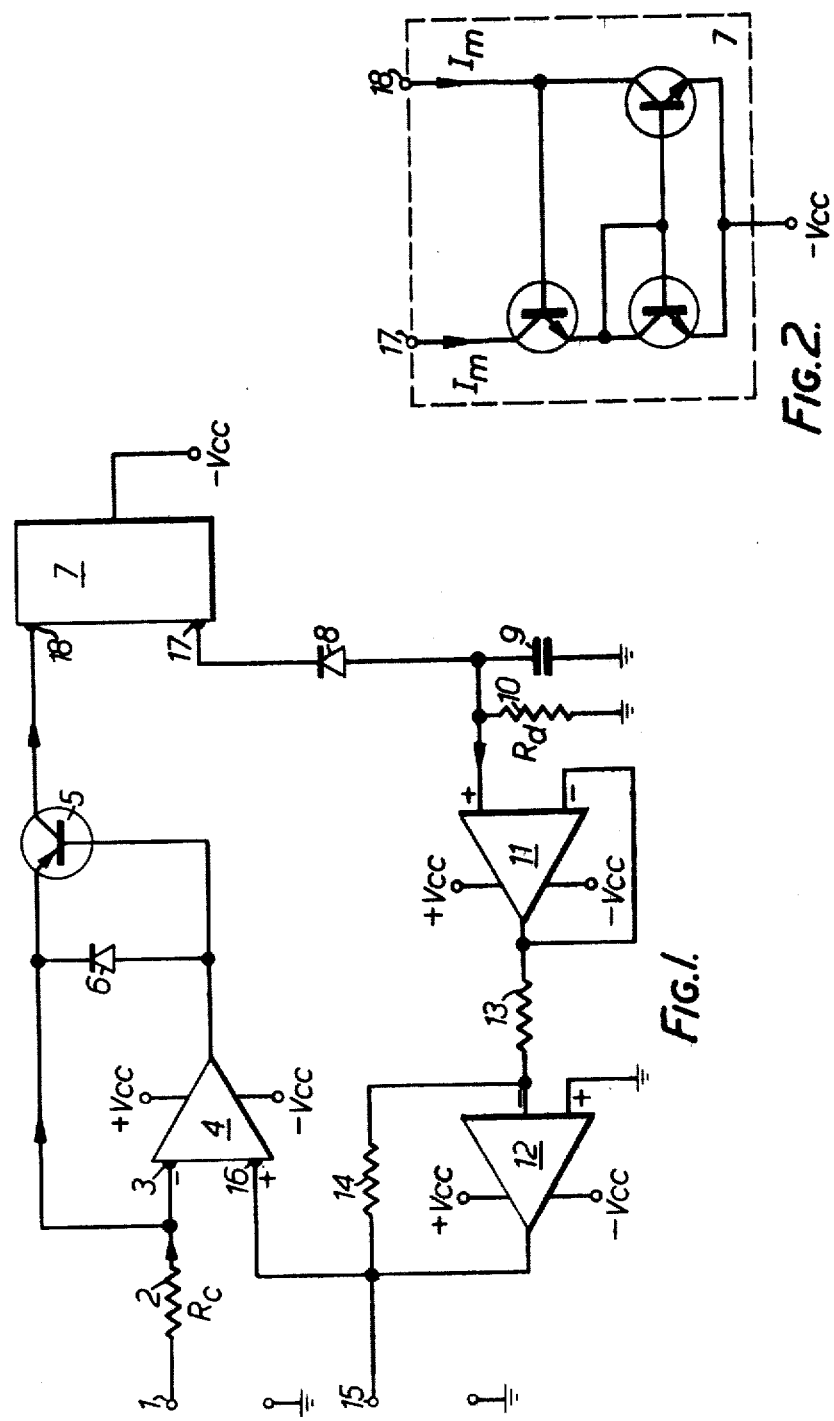

RECTIFIERS

This invention relates to rectifiers, and is particularly concerned with rectifiers having precisely definable charge and/or discharge time constants. The need for such rectifiers arises, for example, in connection with instruments intended to meet stringent noise measurement specifications, and in such applications it is important that the charge and discharge characteristics of the rectifier be predictable over a wide dynamic range of input signal levels.

According to this invention a rectifier includes a rectifying device arranged to charge a capacitor in response to an input signal applied to the rectifier; and means for sensing the magnitude of the voltage on the capacitor and for driving a current through the rectifying device which is directly proportional to the difference between the magnitude of the input signal and the instantaneous voltage on the capacitor.

Preferably, the rectifying device is a transistor, the base of which is driven by the output of a comparator circuit having two inputs, one input being arranged to receive the input signal and including a serial resistance, and the other being arranged to receive a signal representative of the instantaneous voltage on the capacitor, the charging time constant of the capacitor being dependent on the value of said serial resistance.

Preferably again, the transistor is the p.n.p. type and its emitter is also arranged to receive the input signal, and a diode is connected between its emitter and base, the diode being sensed so as to conduct only whilst the transistor is non-conductive.

Preferably, a current mirror is provided between the transistor and the capacitor to reverse the direction of current flow applied to the capacitor. Preferably again, the current mirror exhibits a high output impedance to the capacitor, and preferably yet again a diode is connected between the current mirror and said capacitor to further prevent the capacitor discharging through the current mirror.

The invention is further described, by way of example, with reference to the accompanying drawings, in which FIG. 1 shows a rectifier in accordance with the present invention, and FIG. 2 shows part of the rectifier in greater detail.

Referring to FIG. 1, an input signal is applied via an input terminal 1 and a resistor 2 to the inverting input 3 of a differential amplifier 4, and also to the emitter of a p.n.p. transistor 5 which acts as the rectifying device for the rectifier circuit. The base of the transistor is connected to the output terminal of the amplifier 4, and a diode 6 is connected between the emitter and the base of the transistor 5, as shown. The collector of the transistor 5 is connected via a current mirror 7 and a further diode 8 to a capacitor 9 and a resistor 10. The capacitor 9 and resistor 10 feed the non-inverting input of a differential amplifier 11 having a very high input impedance. Typically, amplifier 11 has MOSFET input stages to maximise the input impedance. The amplifier 11 is provided with a feedback loop from its output to its inverting input so that it behaves as a unity gain impedance buffer, and its output is connected to a further differential amplifier 12 which is arranged as a unity gain inverter; the value of the resistors 13 and 14 are made equal to ensure unity gain. The output of this amplifier is connected to the output terminal 15 of the rectifier and also to the non-inverting input terminal 16 of the amplifier 4.

The a.c. input voltage Vin at terminal 1 causes a current $I_{in}$ to flow in the resistor 2. If the resistor 2 has a value $R_c$, then $I_{in}=(V_{in}-V_o)/R_c$ where $V_o$ is the output voltage obtained at terminal 15. The nature of feedback loop around the amplifier 4 causes a current substantially equal to $I_{in}$ to flow through the emitter-collector path of the transistor 5 on the positive half cycles of the input waveform. On the negative half cycles, the diode 6 is rendered conductive, and it is found that the presence of this diode enhances the turn-on characteristic of the transistor 5, and improves the shape of positive-half waveform passed to the current mirror 7. The current mirror 7 is a circuit which is arranged to draw in a current on its terminal 17 which is exactly the same as the current applied to terminal 18 by the transistor 5, and its use enables the polarity of the current $I_{in}$ to be reversed so as to render it more readily compatible with amplifiers 11 and 12. The current mirror 7 presents a high input impedance at terminal 17 and one form of current mirror is shown in FIG. 2. The current $I_{in}$ is used to charge the capacitor 9, with a rise time having a time constant of $C \cdot R_c$ where C is the capacitance of capacitor 9 and $R_c$ is the value of resistor 2.

The discharge time constant of the capacitor is given by $C \cdot R_d$ where $R_d$ is the value of resistor 10, and $R_d$ is much greater than $R_c$. The high input impedance at terminal 17 of the current mirror 7, and the diode 8, and the high input impedance of amplifier 11 all ensure that the discharge path of the capacitor 9 is through resistor 10.

The voltage $V_o$ present on the capacitor 9 is passed through the amplifier 11, which acts as an impedance buffer, and through amplifier 12, which is a unity gain inverter, and is then applied as a feedback signal to the non-inverting terminal 16 of the amplifier 4.

The characteristics of the rectifier described above are such that the charge and discharge time constants depend on the values C, $R_c$ and $R_d$ of the passive components capacitor 9, resistor 2, and resistor 10 respectively. The use of the feedback loop considerably reduces the effective offset voltage of the rectifying device constituted by the transistor 5, thus resulting in linear operation of the rectifier over a very wide dynamic range of input signal levels. This is in contrast to some known rectifiers using feedback loops, which do not provide a truly linear response, except over a very restricted input dynamic range. Additionally, since the charge and discharge time constants depend wholly on passive circuit elements, the charge and discharge characteristics are properly exponential in profile.

Current mirror 7 is a known circuit, and one example of the form it can take is shown in FIG. 2. The internal arrangement is such that the current applied to terminal 18 causes an equal current, in the same sense, to be drawn in at terminal 17.

It is assumed that the rectifier is driven from a source, connected to terminal 1, of a kind having a low output impedance, so that the charging characteristic is determined by the value $R_c$ of resistor 2. If necessary an impedance buffer can be inserted between terminal 1 and resistor 2 if the rectifier is to be fed from a source having an impedance which is not significantly less than $R_c$.

I claim:

1. A rectifier including a capacitor, a rectifying device constituted by a transistor which is arranged to charge said capacitor in response to an input signal applied to the rectifier; means for sensing the magnitude of the voltage on the capacitor and for driving a current through the transistor which is directly proportional to the difference between the magnitude of the input signal and the instantaneous value on the capacitor; said means including a comparator circuit having two input terminals, a resistance connected to one input terminal and being arranged to receive the input signal, the other input terminal being arranged to receive a signal representative of the instantaneous voltage on the capacitor, the base of said transistor being driven by the output of the comparator circuit and the emitter-collector path of said transistor being connected between said one input terminal and said capacitor whereby the charging time constant of said capacitor is dependent on the value of said resistance.

2. A rectifier as claimed in claim 1 and wherein the transistor is the p.n.p. type and its emitter is also arranged to receive the input signal, and a diode is connected between its emitter and base, the diode being poled so as to conduct only whilst the transistor is non-conductive.

3. A rectifier as claimed in claim 1 or 2 and wherein a current mirror is provided between the transistor and the capacitor to reverse the direction of current flow applied to the capacitor.

4. A rectifier as claimed in claim 3 and wherein the current mirror exhibits a high output impedance to the capacitor.

5. A rectifier as claimed in claim 4 and wherein a diode is connected between the current mirror and said capacitor to further prevent the capacitor discharging through the current mirror.

6. A rectifier circuit having a precisely definable charge time constant which is properly exponential in profile over a very wide dynamic range of input signal levels, which comprises in combination:
   a comparator having a pair of input terminals and an output terminal,
   a resistor connected to one of said input terminals and providing an input path for the input signal to said one input terminal,
   rectifier means also connected to said one input terminal and to said output terminal for controlling current flow through said resistor, during like polarity half cycles of the input signal, in accord with the output at said output terminal,
   a capacitor and means for charging said capacitor with a current directly proportional to the current controlled by said rectifier means; and
   means controlling the voltage value of the other input terminal of the comparator in accord with the instantaneous voltage on said capacitor whereby the charge time constant of said capacitor is precisely defined by said resistor and is exponential in profile over a very wide dynamic range of input signal levels.

7. A rectifier circuit as defined in claim 6 wherein the means last mentioned comprises unity gain amplifier means connected between said capacitor and said other input terminal whereby to isolate said capacitor from the comparator and provide a buffered output for the circuitry.

8. A rectifier circuitry as defined in claim 6 or 7 wherein said rectifier means comprises a transistor having its collector-emitter path connected between said one input terminal and said means for charging and having its base connected to said output terminal of the comparator.

9. A rectifier circuitry as defined in claim 8 including a discharge path resistor connected to said capacitor whereby the discharge time constant of the circuitry is precisely defined by the discharge path resistor and is exponential in profile.

* * * * *